(12) United States Patent
Hakamo et al.

(10) Patent No.: US 11,431,081 B2
(45) Date of Patent: Aug. 30, 2022

(54) CAPACITOR STRUCTURE AND A CHIP ANTENNA

(71) Applicant: COREHW SEMICONDUCTOR OY, Tampere (FI)

(72) Inventors: Markus Hakamo, Lempäälä (FI); Tomi-Pekka Takalo, Pirkkala (FI); Petri Kotilainen, Tampere (FI); Petri Heliö, Tampere (FI)

(73) Assignee: COREHW SEMICONDUCTOR OY, Tampere (FI)

( * ) Notice: Subject to any disclaimer, the term of this patent is extended or adjusted under 35 U.S.C. 154(b) by 0 days.

(21) Appl. No.: 17/558,663

(22) Filed: Dec. 22, 2021

(65) Prior Publication Data

US 2022/0200131 A1   Jun. 23, 2022

Related U.S. Application Data

(63) Continuation of application No. PCT/FI2019/050513, filed on Jun. 28, 2019.

(51) Int. Cl.
*H01Q 1/38*   (2006.01)
*H01Q 1/22*   (2006.01)
(Continued)

(52) U.S. Cl.
CPC ....... *H01Q 1/2283* (2013.01); *H01L 23/5223* (2013.01); *H01L 23/5226* (2013.01);
(Continued)

(58) Field of Classification Search
CPC .... H01Q 1/2283; H01Q 1/38; H01L 23/5223; H01L 23/5226; H01L 23/66; H01L 28/90; H01L 2223/6677
See application file for complete search history.

(56) References Cited

U.S. PATENT DOCUMENTS 6,690,570 B2 *   2/2004   Hajimiri ............... H01L 28/82
                                                            361/309
2014/0103490 A1   4/2014   Kumar et al.
(Continued)

FOREIGN PATENT DOCUMENTS

| CN | 102456665 B | 6/2016 |
|---|---|---|
| TW | 201044504 A | 12/2010 |
| TW | 201432869 A | 8/2014 |

OTHER PUBLICATIONS

Aparicio R et al: "Capacity limits and matching properties of integrated capacitors", IEEE Journal of Solid-State Circuits, IEEE Service Center, Piscataway, NJ, USA, vol. 37, No. 3, Mar. 1, 2002 (Mar. 1, 2002), pp. 384-393, XP002252607, ISSN: 0018-9200, DOI: 10.1109/4.987091.
(Continued)

*Primary Examiner* — David E Lotter
(74) *Attorney, Agent, or Firm* — Robert P. Michal, Esq.; Carter, DeLuca & Farrell LLP

(57) ABSTRACT

A capacitor structure implemented using a semiconductor process. The capacitor structure includes a plurality of interdigitated positive and negative electrode fingers separated by a dielectric material, and a plurality of patterned metallization layers separated by the dielectric material. Each interdigitated electrode finger comprises a lateral part formed on one of at least two essentially parallel first metallization layers and a vertical part includes a plurality of superimposed slabs or bars disposed on a plurality of second metallization layers between said first metallization layers and electrically connected to each other and to the lateral part with a plurality of electrically conducting vias traversing through dielectric material separating adjacent metallization layers. Vertical distance between each pair of at least partially superimposed lateral parts of two adjacent electrode fingers is substantially equal to lateral distance between two adjacent vertical parts.

15 Claims, 12 Drawing Sheets

(51) Int. Cl.
  *H01L 23/66* (2006.01)
  *H01L 49/02* (2006.01)
  *H01L 23/522* (2006.01)

(52) U.S. Cl.
  CPC .............. *H01L 23/66* (2013.01); *H01L 28/90* (2013.01); *H01Q 1/38* (2013.01); *H01L 2223/6677* (2013.01)

(56) References Cited

U.S. PATENT DOCUMENTS

| | | | |
|---|---|---|---|
| 2014/0203401 A1* | 7/2014 | Li | ........................... H01L 28/91 257/532 |
| 2014/0203404 A1 | 7/2014 | Choi et al. | |
| 2015/0022948 A1 | 1/2015 | An et al. | |
| 2016/0163692 A1 | 6/2016 | Moghe et al. | |
| 2020/0043874 A1* | 2/2020 | Sira | ..................... H01L 27/0629 |

OTHER PUBLICATIONS

International Search Report issued by the European Patent Office acting as the International Searching Authority in relation to International Application No. PCT/FI2019/050513 dated Jan. 23, 2020 (4 pages).

Written Opinion of the International Searching Authority issued by the European Patent Office acting as the International Searching Authority in relation to International Application No. PCT/FI2019/050513 dated Jan. 23, 2020 (7 pages).

Taiwanese Office Action and Search Report issued by the Taiwanese Intellectual Property Office in relation to Taiwan Application No. 109121607 date stamped Jun. 21, 2021 (9 pages) along with English language translation (7 pages).

* cited by examiner

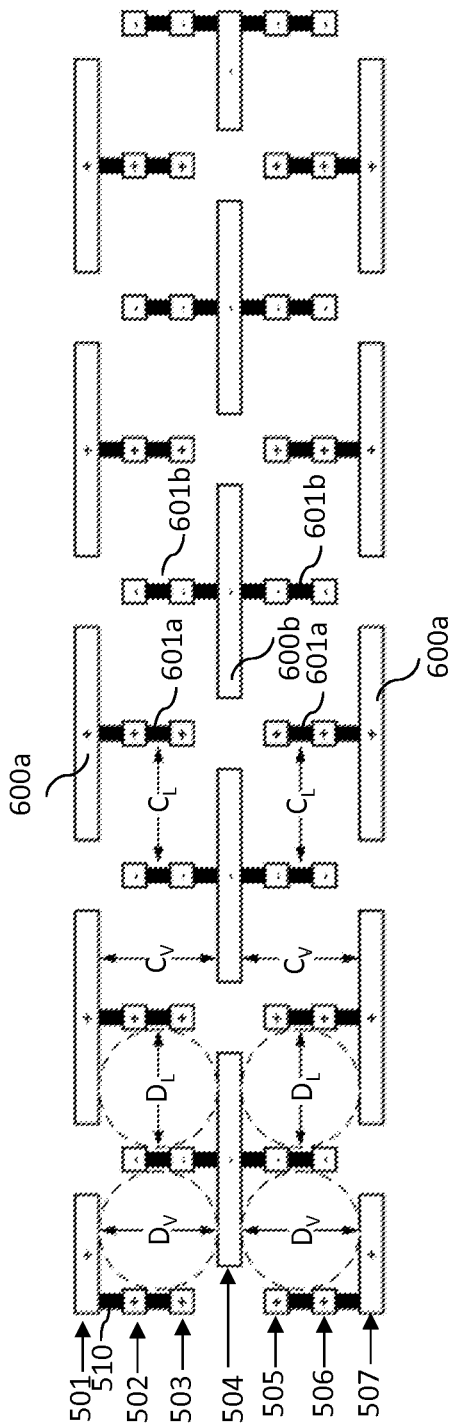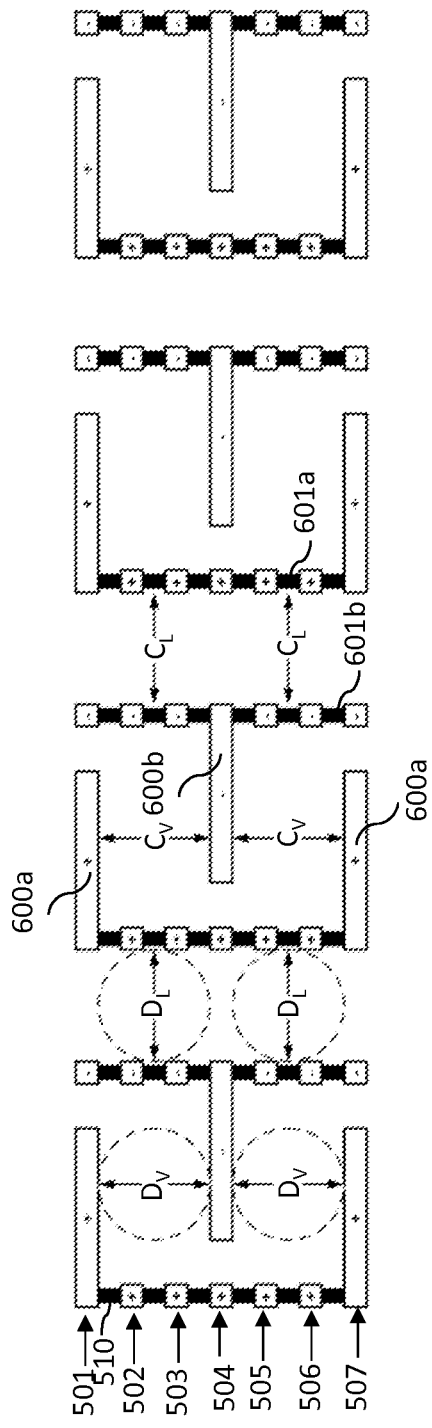
Figure 11
Figure 12

CAPACITOR STRUCTURE AND A CHIP ANTENNA

CROSS-REFERENCE TO RELATED APPLICATIONS

This application is a continuation of PCT International Application No. PCT/FI2019/050513 filed Jun. 28, 2019, the disclosure of this application is expressly incorporated herein by reference in its entirety.

FIELD

The present invention relates to a semiconductor device structure, in particular to a capacitor structure. More particularly, the present invention discloses a chip antenna implemented by a semiconductor process.

BACKGROUND

FIG. 1a shows a parallel plate capacitor with conductor plate length L, conductor plate width W and distance between two plates (100, 102) is D. A gap between the first conductor plate (100) and the second conductor plate (102) is filled with dielectric medium (101) having thickness D and relative permittivity of $\epsilon_r$ and $\epsilon_0$ is constant for permittivity of vacuum. Capacitance of the parallel plate capacitor is given by equation:

$$C = \epsilon_0 \times \epsilon_r \times (W \times L)/D \quad (1)$$

In semiconductor industry, when insulator is used as the dielectric medium (101), this kind of capacitor is commonly manufactured by placing insulator material between two flat sheets of metal, and thus it is commonly called as a Metal-Insulator-Metal (MIM) capacitor.

The equation (1) is accurate when dimensions of the conductor plates (100, 102), in particular its width (W) and length (L) are both clearly greater than distance (D), because in this case electric field can be assumed to constant between the plates and zero everywhere else, and any fringing field can be neglected. Because the capacitance is directly proportional to the dimensions W and L and inversely proportional to D, assuming absolute tolerances of W, L and D, are in the same order of magnitude but W and L are both clearly greater than D, most critical dimension from capacitance tolerance point of view is obviously D. FIG. 1b shows a cross-section of the capacitor of the FIG. 1a. The electric flux (103) between the conductor plates (100, 102) is primarily located between the conductor plates (100, 102).

If either W or L is not large compared to D, then also fringing field around the edges of the capacitor has significant contribution to the total capacitance and should be taken into account. This is the case with a Vertical Parallel Plate (VPP) capacitor structure show in FIG. 2a. The structure is rotated in comparison to that of the FIG. 1a in a way that direction of electric flux has been rotated 90 degrees. In this particular case width W of the capacitor plates cannot be considered significantly greater than distance D. An equation (2) corresponding to (1) can still be used for roughly estimating the capacitance.

$$C \approx \epsilon_0 \times \epsilon_r \times (W \times L)/D \quad (2)$$

FIG. 2b illustrates a cross-section of the capacitor of the FIG. 2a. Fringing electric field (104) at the edges of the parallel plates (100, 120) that is not fully perpendicular to the plates (100, 102) has more significant effect on the total capacitance.

In mobile wireless devices such as mobile phones, tablets, trackers or internet of things devices internal antennas are usually preferred over external antennas. Antenna size is typically very limited and compact antenna solutions are needed. This antenna downsizing imposes severe design issues for antenna engineers. Use of non-optimal antenna solutions can degrade operating range of wireless device but can also have detrimental influence e.g. on the battery life of the device.

Performance of a small antenna can change radically when finite size ground plane is present, depending on size and shape of the ground plane or positioning of the antenna on the ground plane. In wireless mobile devices, antenna performance is practically always heavily dependent on size and the shape of the ground plane, regardless of use resonant or non-resonant antenna. Examples of resonant type of wireless mobile device antennas are for example patch antennas, quarter wavelength monopole antennas, and loop antennas, and slot antennas (and variations, such as inverted-L antennas (ILA) and inverted-F antennas (IFA)). A patch antenna consists of a flat sheet or "patch" of a metal mounted over a larger sheet forming a ground plane. A monopole antenna consists of a metal "stub" mounted on or of next to a ground plane. A resonant antenna element has at least one physical dimension, which makes it resonant at the frequency of operation, for example half wavelength ($\lambda/2$) patch antenna or quarter wavelength ($\lambda/4$) monopole. Non-resonant antenna element is typically physically smaller than resonant size and requires impedance matching. In that case the ground plane forms the main radiating structure, and "non-resonant antenna structure" operates more or less as a coupling device. Sometimes they also referred to as "excitation elements", because small antenna elements are used to "excite" the PCB/chassis wave modes. Or in some cases—if author does not want to express the contribution of the conductive chassis on the radiation properties—they may also be called simply to as antenna elements, radiator electrodes or even radiators.

Slot antenna is one common antenna type used in mobile wireless devices. The slot antenna is basically constructed by making a slot in a conductive sheet. The slot can be fully enclosed by conductive sheet in which case the lowest resonance mode of the slot itself is a half wavelength ($\lambda/2$), or the slot may have opening to edge of the conductive sheet, in which case the lowest resonance mode of the slot will be a quarter wavelength ($\lambda/4$). The latter type of slot antenna may also be called notch antenna. For feeding a slot antenna efficiently, impedance matching is typically required. A series matching capacitor may need to be added on antenna feed for impedance matching.

In the scope of the invention terms chip antenna, non-resonant chip antenna and ultraminiature chip antenna all refer to a capacitor device, for example a surface mount chip capacitor (SMD capacitor) device, which may be implemented as a discrete semiconductor that is used for impedance matching of antenna structures. In connection to the invention terms ultraminiature chip antenna, chip antenna and non-resonant chip antenna may be used interchangeably. Antenna implementations utilizing chip antennas may be based on various operating principles known in the art, such as a monopole, an inverted-F antenna (IFA), a loop antenna or a slot antenna. In a loop type of configuration chip antenna is used as a part of a loop, where it mainly operates as a capacitive tuning element. Also manufacturing methods used for producing chip antennas are various, but in many cases chip antennas are made on a high dielectric substrate, in other words a substrate with high dielectric constant, such as ceramic, to reduce the physical size of the antenna. By using high dielectric substrate, non-resonant chip antennas will have higher capacitance density, thus enabling smaller size to achieve required capacitance.

DESCRIPTION OF THE RELATED ART

U.S. Pat. No. 6,690,570 discloses a vertical parallel plate capacitor defined by interdigitated vertical plate electrodes formed by conductor layers coupled with each other with electrically conducting vias.

In comparison to ceramic capacitors, Metal-Oxide-Metal (MOM) capacitors enable smaller size with higher accuracy. Further, scalability and price are better for MOM capacitors, because these may be manufactured using semiconductor processes in big volumes.

With an interdigitated electrode structure, lower fabrication cost and higher capacitance density is achieved in comparison to more traditional plate type capacitors. However, due to manufacturing process variations of this type of semiconductor devices, capacitance value tolerances are large. In other words, accuracy of the capacitance values achieved is poor, which causes problems in manufacturing devices for certain applications that require accurate capacitor values. Individual selection of capacitors is not commercially feasible in mass production, but variance of capacitance values in a large mass of capacitor devices needs to be controlled in cost-efficient way.

SUMMARY

An object is to provide a method and apparatus so as to solve the problem of providing an improved capacitor device, which is particularly useful as a chip antenna.

The preferred embodiments of the invention are disclosed in the dependent claims.

The present invention is based on the idea of a novel shaping the capacitor plates into a structure that has both vertical and lateral parallel plates.

According to a first aspect, a capacitor structure is provided that is implemented using a semiconductor process. The capacitor structure comprises a plurality of interdigitated positive and negative electrode fingers separated by a dielectric material, and a plurality of patterned metallization layers separated by the dielectric material. Each interdigitated electrode finger comprises a lateral part formed on one of at least two essentially parallel first metallization layers, and a vertical part comprising a plurality of superimposed slabs or bars disposed on a plurality of second metallization layers that reside between said first metallization layers. Said slabs or bars are electrically connected to each other and to the lateral part with a plurality of electrically conducting vias traversing through dielectric material separating adjacent metallization layers. Vertical distance between each pair of at least partially superimposed lateral parts of two adjacent electrode fingers is substantially equal to lateral distance between two adjacent vertical parts.

According to a second aspect, parts of two adjacent electrode fingers are disposed on different one of the first metallization layers.

According to a third aspect, said more than one superimposed slabs or bars further comprise a slab or bar disposed on the first metallization layer that does not comprise the vertical part of the same electrode finger.

According to a fourth aspect, two interdigitated combs are formed by the plurality of positive electrode fingers mutually electrically coupled at one end of the fingers and the plurality of negative electrode fingers mutually electrically coupled at an opposite end of the fingers.

According to a fifth aspect cross-section of the mutually coupled vertical part and lateral part of two interdigitated electrode finger forms an L-shape. The lateral part forms the leg of the L-shape and the vertical part forms the stem of the L-shape. Legs of two adjacent L-shapes extending to mutually opposite lateral directions are disposed on different first metallization layers of the capacitor structure and stems of adjacent L-shapes point in opposite vertical directions.

According to a sixth aspect, the lateral distance is defined between different adjacent electrode finger than the vertical distance.

According to a seventh aspect, the capacitor structure comprises three first metallization layers. The capacitor structure is mirrored with respect to the first metallization layer that forms legs of positive or negative interdigitated L-shape electrode fingers such that each of the positive or negative electrode fingers comprises two lateral parts superimposed with each other and disposed on two opposite faces of the capacitor structure, and a vertical part coupling the two lateral parts. Its adjacent negative or positive electrode finger comprises a single lateral part disposed on a first metallization layer that is disposed between the two opposite faces of the capacitor structure and two vertical parts directed to opposite vertical directions from the single lateral part. The single lateral part is at least partially superimposed between the two lateral parts.

According to an eighth aspect, cross-section of the mutually coupled vertical part and the lateral part of two interdigitated electrode finger forms a T-shape. The lateral part forms the arm of the T-shape and the vertical part forms the stem of the T-shape. Stems of adjacent T-shapes point in opposite vertical directions and arms of adjacent T-shapes are disposed on different one of the first metallization layers of the capacitor structure.

According to a ninth aspect, the lateral distance is defined between the same adjacent electrode finger as the vertical distance.

According to a tenth aspect, the capacitor structure comprises three first metallization layers, and the capacitor structure is mirrored with respect to the first metallization layer that forms arms of positive or negative interdigitated T-shape electrode fingers such that there is a pair of positive or negative T-shape electrode fingers with their lateral parts superimposed with each other and disposed on two opposite faces of the capacitor structure, and their vertical parts directed to opposite directions towards each other. Their adjacent negative or positive electrode finger comprises a single lateral part disposed on a first metallization layer that is disposed between the two opposite faces of the capacitor structure and two vertical parts directed to opposite vertical directions from the single lateral part. The single lateral part is at least partially superimposed between the two lateral parts.

According to an eleventh aspect, spacing between any parts of two adjacent electrode fingers is at least 5 times, preferably at least 10 times a minimum manufacturing process line width of a manufacturing process used in manufacturing the capacitor structure.

According to a twelfth aspect, a chip antenna device is provided that comprises at least one, preferably at least two capacitor structures according to any of the preceding aspects.

According to a thirteenth aspect, the chip antenna device is disposed in a wafer level chip scale ball grid array (WLCSP BGA) package.

According to a fourteenth aspect, the chip antenna device further comprises at least one adjustable capacitor in shunt and/or series configuration.

According to a fifteenth aspect, an antenna structure is provided, that exploits ground plane radiation. The antenna structure comprises a chip antenna according to any one of aspects twelve to fourteen.

The present invention has the advantage that capacitance and reactance tolerance of the capacitor is improved, in other words capacitance values of capacitors are more accurate, losses are reduced, and maximum voltage rating is achieved that fulfills requirements for high power applications. The invented capacitor structure effectively compensates effects of manufacturing tolerances on the capacitance values, thus compensating capacitance variation. Further, capacitance density achieved with the invented capacitor structure enables manufacturing of capacitance values that are particularly useful in chip antennas of mobile wireless devices with physical dimensions that fit well in physical dimensions of other active elements of the antenna.

This facilitates short interconnections, which improves antenna performance.

BRIEF DESCRIPTION OF THE DRAWINGS

In the following the invention will be described in greater detail, in connection with preferred embodiments, with reference to the attached drawings, in which

FIG. 11 is a schematic cross-sectional view of a third embodiment of the invented capacitor structure.

FIG. 12 is a schematic cross-sectional view of a fourth embodiment of the invented capacitor structure.

DETAILED DESCRIPTION

As known in the art, a semiconductor device is typically manufactured in layers. In such layered semiconductor device, both terms lateral and horizontal are commonly used to refer to a structure that extends along a layer of material. A lateral structure may extend along a surface of the semiconductor device, or it may be embedded between other lateral layers. Correspondingly, term vertical is used to refer to a structure that extends in a direction perpendicular to a lateral layer. A vertical structure traverses through or between a plurality of material layers. Lateral and vertical structures thus have essentially 90-degree transpose.

Figure 1A:
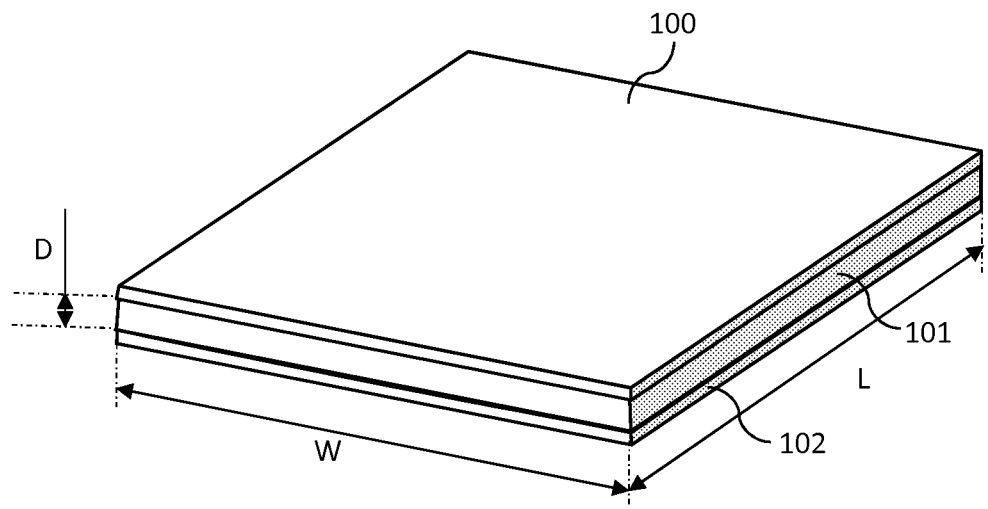
FIGS. 1a and 1b illustrate a lateral parallel plate capacitor.
Figure 1B:
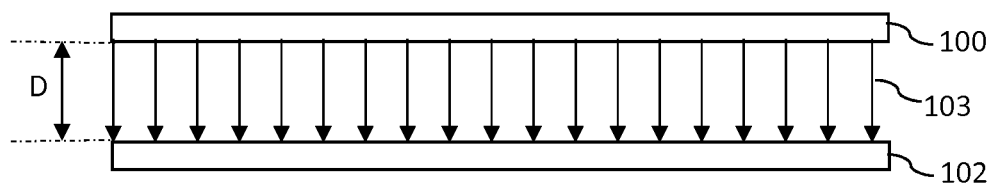
Figures 2A, 2B:
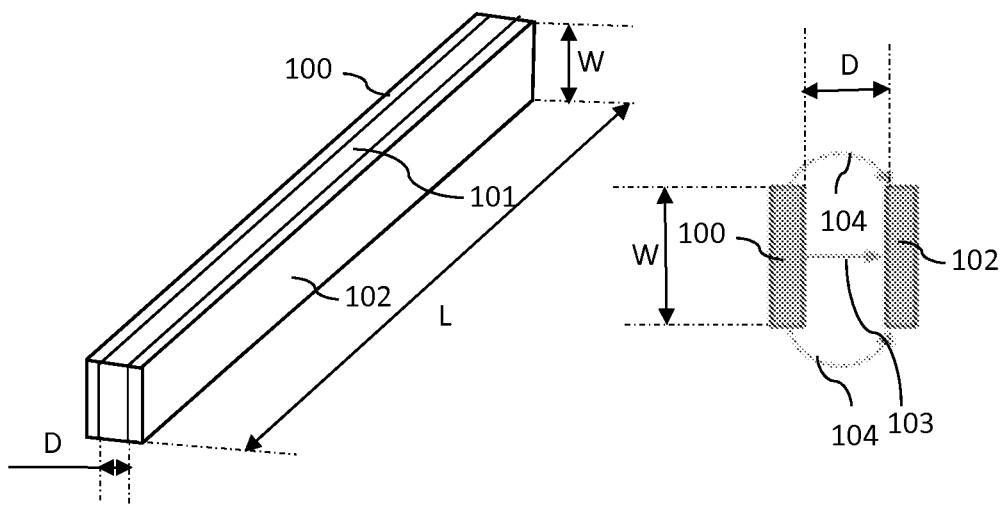
FIGS. 2a and 2b illustrate a vertical parallel plate capacitor
Figure 3A:
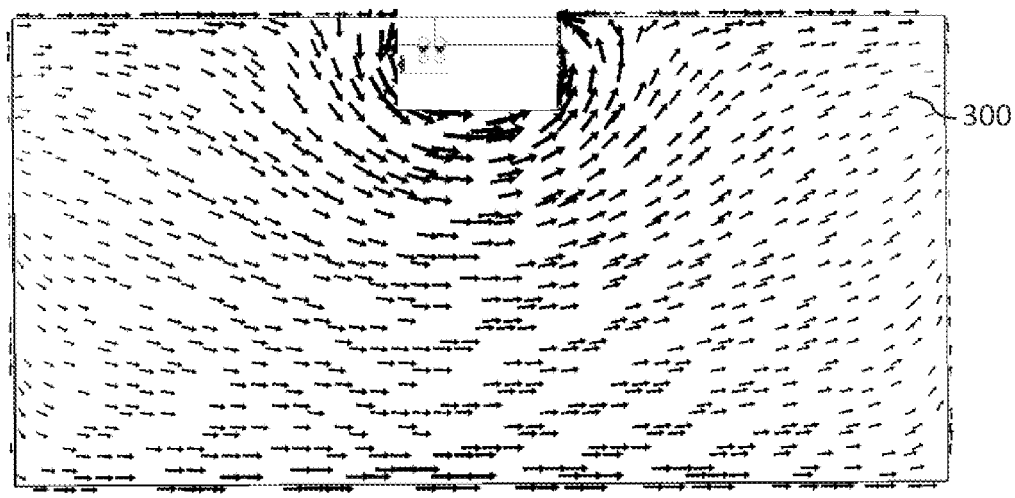
FIGS. 3a and 3b illustrate a communication device antenna implemented with a chip antenna.
Figure 3B:
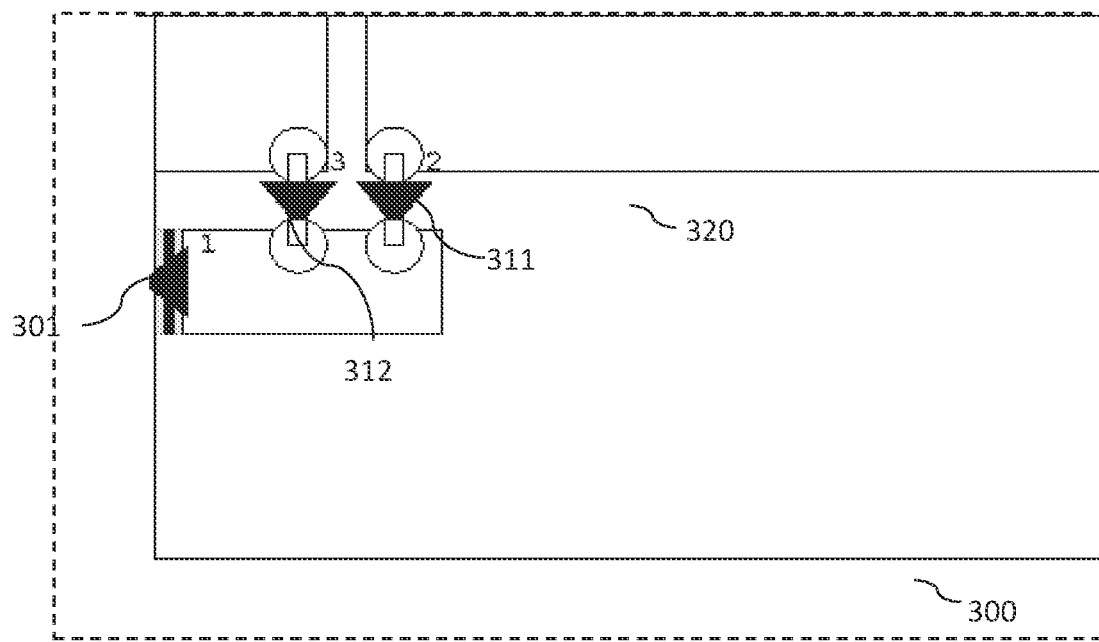

FIGS. 3a and 3b illustrate an exemplary embodiment of a communication device antenna implemented with a chip antenna. The antenna shown in FIGS. 3a and 3b is of slot type.

Electromagnetic wavemode describes the electromagnetic field pattern. FIG. 3a shows a rectangular ground plane with a slot antenna. The ground plane is shown with a surface current vector plot of wavemode on the ground plane (300).

FIG. 3b is an enlarged view of the device of the FIG. 3a, showing in more detail elements of the antenna structure. A radio frequency (RF) signal to be transmitted with the antenna is fed to the antenna through an antenna feed port (301) and a chip antenna with two capacitors (311, 312), a parallel capacitor (312) and a series capacitor (311), is used for impedance matching. It should be noticed that although not shown, capacitors (311, 312) of the chip antenna preferably form a single semiconductor package for easier installation compared to two separate capacitors. Manufacturing the capacitors in a single semiconductor device also improves relative accuracy of their capacitances. The ground plane (300) comprises a recess portion (320). In the shown embodiment, the recess portion can be characterized as a slot, but it may alternatively be designed as a loop or a notch. The ground plane (300) may be a PCB ground plane or a chassis of the mobile wireless device.

Figure 4:
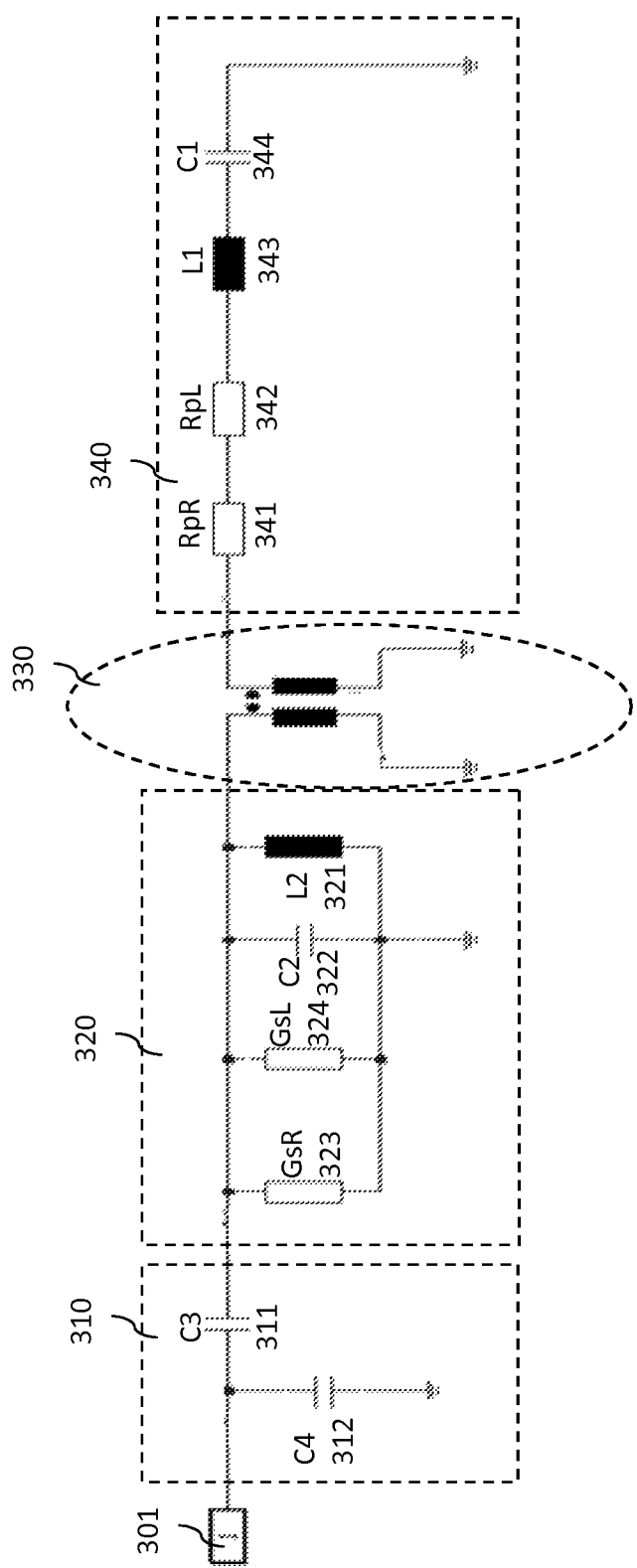
FIG. 4 illustrates a simplified circuit model equivalent to an antenna.

The FIG. 4 illustrates a simplified circuit model equivalent to the antenna functionality of the device of the FIGS. 3a and 3b.

The antenna feed port (301) provides connection to RF circuitry interface of the wireless mobile device. The chip antenna component (310) comprises a parallel capacitor C4 (312) and a series capacitor C3 (311). Preferably the two capacitors (311, 312) are comprised in a single chip antenna device to facilitate physical proximity and short interconnections. Further placing the capacitors in a single device also facilitates improved relative accuracy between the two capacitors, makes installation process easier compared to two separate capacitor devices and further facilitates simple production and logistics. The chip antenna mainly operates as a tuning and/or matching element, which becomes obvious from the circuit model.

A parallel resonance circuitry (320) represents effects of the ground plane recess portion (320). If the recess portion (320) in the ground plane (300) is small in comparison to wavelength of transmitted and received radio signals, having perimeter in range of $\lambda/8$ or less, the contribution of the recess portion (320), such as the exemplary slot in the FIG. 3, on total radiation is very small, and almost all radiation originates from the ground plane (300). The recess portion (320) merely acts as a coupling element, which is reflected in the circuit model in a way that resonance frequency of a resonator formed by an inductance L2 (321) and a capacitance C2 (322) is significantly higher than operating frequency of the antenna. Additionally, radiation portion of slot conductance GsR (323) is almost zero, meaning that there is almost no radiation originated from the recess portion (320) and the real part of the admittance of the recess portion (320) is almost exclusively associated with losses described by loss portion of slot conductance GsL (324). The radiation portion of slot conductance GsR (323) refers to a portion of conductance caused by the slot that is associated with radiation, and the slot portion of slot conductance GsL (324) refers to a portion of conductance caused by the slot that is associated with losses.

A transformer (330) represents coupling between the ground plane recess (320) and PCB wave mode (330).

Finally, a series resonance circuit (340) represents wave mode of the PCB or chassis ground plane (300). Provided that length of the ground plane (300) is close to optimal, i.e. roughly $(2n+1)*\lambda/2$ with n={0, 1, 2, ... }, and wherein X is the approximate wave length of the RF signal, the ground plane (300) is resonant wavemode close to the intended operating frequency, with decent radiation resistance RpR (341), and reasonably low loss resistance RpL (342). Such reasonably low resistance may be for example resistance that is order of magnitude smaller compared to RpR (341), in other words at least one tenth of the RpR (341). The radiation resistance RpR (341) refers to a portion of the PCB or chassis wavemode resistance that is associated with radiation of the PCB or chassis, and the loss resistance RpL (342) corresponds to a portion of the PCB or chassis wavemode resistance that is associated with losses in the PCB or chassis. When current I travels through the resistors representing the PCB or chassis wavemode, loss of power in the PCB or chassis wavemode due to loss resistance RpL is given by equation $I^2*RpL$ and correspondingly radiated power due to the radiation resistance RpR is given by equation $I^2*RpR$. Inductance L1 (343) illustrates inductance associated with the PCB or chassis wavemode and capacitance C1 (344) illustrates capacitance associated with the PCB or chassis wavemode. In this case the antenna arrangement can have good performance even with a chip antenna and relatively small recess portion (320), provided that the part-to-part variation of the chip antenna is not too large.

On the other hand, if the chip antenna design is different (e.g. different capacitance values) so that it requires that the recess portion (320) in the ground plane (300) is larger, with perimeter in range of $\lambda/4$ or larger, the recess portion (320) will have higher contribution on to the total radiation. It also means better antenna performance, including at least higher efficiency and broader bandwidth, and antenna performance becomes less dependent on the ground plane size and shape and hence less vulnerable for ground plane dimension or antenna location changes.

However, tolerances of the capacitance of the chip antenna become important for controlling antenna resonance frequency and matching variation. Especially accuracy of the series capacitor is highly important. Thus, a capacitor is needed that is not vulnerable to variations of tolerances within the manufacturing process.

However, currently available commercial semiconductor capacitors have quite large tolerances, which are caused for example due to variation in layer thicknesses in manufacturing process of the semiconductor capacitor device. Also multilayer ceramic chip antennas typically have large tolerance variation due to variation in ceramic manufacturing process.

Figure 5A:
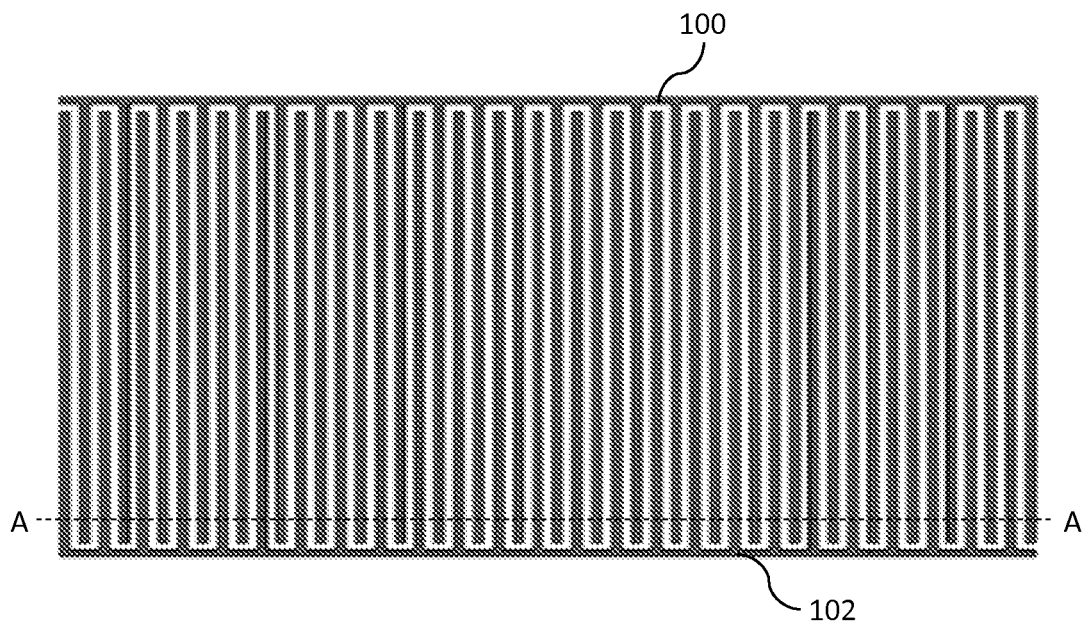
FIG. 5a illustrates a top view of a VPP capacitor.
Figure 5B:
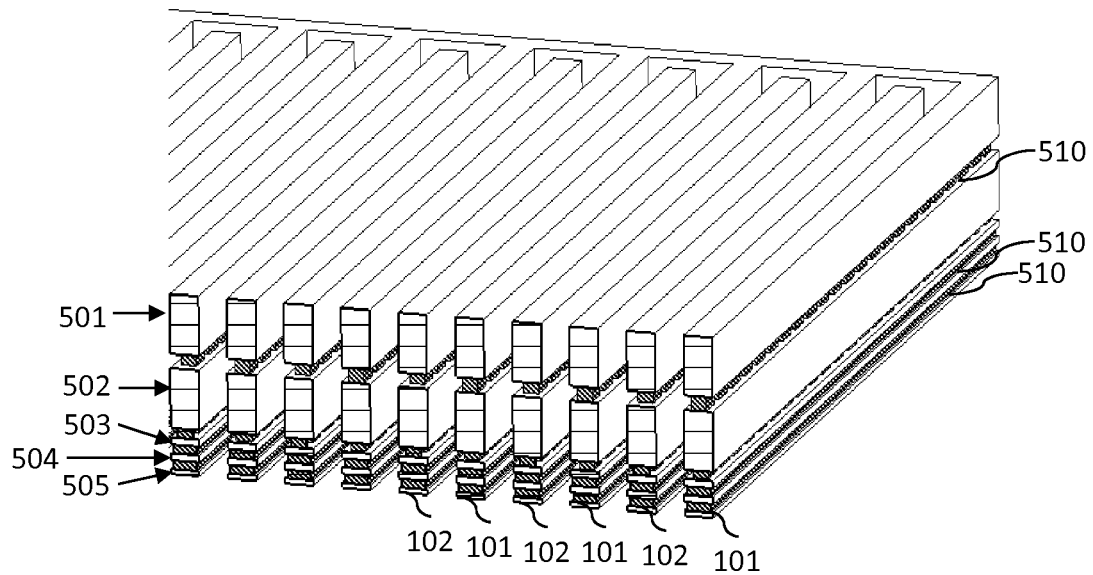
FIG. 5b shows a perspective view of the VPP capacitor.

FIG. 5a illustrates a top view of a metallization layer of a vertical-parallel-plate (VPP) capacitor in which positive and negative electrodes comprise a pattern of stacked interdigitated metal finger structure with via patterns connecting superimposed metallization layers together. Dielectric material between the structures is not shown. FIG. 5b shows a perspective view of the metal parts of the same structure, along cutting line A-A shown in the FIG. 5a. This view shows the metallization layers (501-505) and interconnecting vias (510) of the vertical plate electrodes. This structure is in principle similar to U.S. Pat. No. 6,690,570 referred earlier. Vertical stacks of the simulated device comprise two thick metallization layers (501, 502) and three thinner metallization layers (503, 504, 505).

The vertical structure shown in FIG. 5b which is typical for radio frequency integrated circuit back end of line (RFIC BEOL) metallization with thick metal options, which are useful for example for creating low loss RF coils or transmission lines and multiple thinner layers for less critical fine pitch routing and connections for semiconductor devices. Unfortunately, that is not optimal for layer structure for manufacturing tolerance control, because the two thick metallization layers will likely dominate in thickness variation, full potential of the tolerance improvement cannot be exploited. Further, when maximum capacitance density is pursued, distance between fingers becomes small, which causes increased risk of voltage breakdown. Further large manufacturing tolerances cause high capacitance tolerances. All of these characteristics cause such capacitor not to be particularly suitable for antenna interfaces.

If thickness variation of layers is uncorrelated, then the variance of total stack-up height, in other words sum of the thicknesses of all layers, is the sum of individual layers thickness variances. Hence the deviation of the total stack-up thickness will be smaller than the sum of deviations of individual layer thicknesses. However, if the variation of the layer thicknesses is correlated, that is not necessarily true. The same applies for the layer wise metallization width tolerances i.e. lateral shape tolerances of metallization structures. Lateral shape tolerances define lateral shape accuracy.

Nominal and worst-case capacitance corners with metallization and/or semiconductor layer thickness variation and lateral shape variation of a VPP capacitor of the FIGS. 5a and 5b were simulated using 3D electromagnetic simulations. In the simulated structure, width of the finger metallization was 2 μm, the gap between fingers was 3 μm, height of metal stack, in other words, the height of the vertical capacitor plate was about 10 μm and the total area occupied by the capacitor was 217 μm×144 μm. These exemplary dimensions are relatively large for a semiconductor capacitor, meaning also relatively low capacitance density, but on the other hand better relative tolerances and higher breakdown voltages. The thickness variation alone causes +15% to −13% worst case capacitance variation at 2.45 GHz. Taking also lateral shape tolerances into account, that causes variation in the location of the lateral edges of the metal parts, the worst-case capacitance variation will increase to +27% . . . −18%. This amount of capacitance variation causes unacceptable variation in performance of the antenna.

One way to improve capacitance tolerance would be increasing distance of capacitor finger plates. A VPP capacitor structure with sparse electrode spacing where the lateral spacing of the vertical capacitor plates was increased from 3 µm to 13 µm was also simulated. Capacitance variation caused by thickness tolerances was found to reduce to +/−10% and, when considering also lateral tolerances of the metallization layers, the worst-case capacitance variation increased to vary between −11% and +13%. Contribution of the lateral tolerances on the total capacitance variation was hence significantly decreased, from about between 28% and 44% down to about between 9% and 23%. However, also capacitance density dropped significantly as result of larger finger electrode spacing. Such low capacitance density device may, however, be suitable for some applications.

Figure 6:
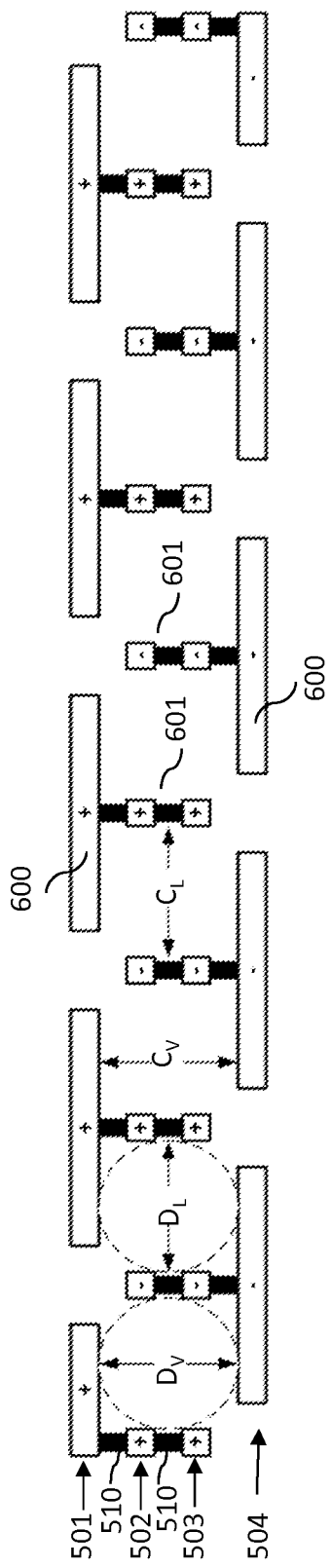
FIG. 6 shows a schematic cross-sectional view of a first exemplary embodiment for a capacitive element.

FIG. 6 shows a schematic cross-sectional view of a first exemplary embodiment of a capacitive element suitable for example for a chip antenna component, that can be manufactured utilizing a plurality of BEOL (back-end-of-line) metallization layers of a semiconductor manufacturing process. The structure comprises a plurality of interdigitated positive (+) and negative (−) electrode fingers. In this example there are four metallization layers (501, 502, 503, 504) and arrays of conductive vias (510) in between metallization layers. In this embodiment, lateral parts of adjacent positive and negative electrode are partially superimposed. In this example with four metallization layers, the first metal (501) layer forms a lateral (horizontal) part of every second electrode finger, and the fourth metallization layer (504) forms a lateral part of the other set of interdigitated electrode fingers. However, any number of metallization layers may be used as long as the metallization layers enable construction of both lateral and vertical structures. The lateral parts of the electrode fingers are provided on metallization layers on the opposite top and bottom faces of the capacitor structure form. In this example, the vertical parts of the electrodes are formed by two superimposed metal slabs or bars formed on the intermediate metallization layers (502, 503) and the vias (510) coupling the two intermediate metallization layers (502, 503) with each other and to one of the lateral parts. Lateral parts extend in lateral direction so that at least one lateral dimension of the lateral part is greater than that of vertical parts.

Although thickness of metallization layers (501, 502, 503, 504) in the FIG. 6 appears approximately equal, actual thickness of metallization layers may vary. The capacitor structure can be considered as a combination of interdigitated capacitors wherein positive and negative electrodes are arranged in alternating manner and adjacent positive and negative electrodes have both vertically and laterally separated electrode plates. Since the vertical and lateral plates are part of the same electrode finger, these may be called as the vertical part and the lateral part. Lateral parts of two adjacent positive and negative electrode fingers have a vertical separation or a vertical distance ($D_V$) between them and vertical parts of two adjacent positive and negative electrode fingers have a lateral separation or a lateral distance ($D_L$) between them. This novel capacitor finger structure may be called as a vertical-lateral-parallel-plate (VLPP) capacitor structure, and the specific embodiment may be called as a T-shaped VLPP capacitor structure, since at least most of the interdigitated finger electrodes have a T-shape cross section, where the lateral part form the arm of the T-shape and the vertical part form the stem of the T-shape. However, as shown in the FIG. 6, electrode fingers that are in the outer sides (ends) of the comb that only have a single adjacent opposite polarity electrode finger may, but do not have to have an L-shape. The target is to create capacitor device structure, which can be created so that it has a small variance of total capacitance without a priori knowledge about layer wise thicknesses and/or so that the capacitance is insensitive to variations of the metallization layer and via stack in the vertical dimension.

If the length of the fingers is L, capacitance $C_i$ of one pair of fingers is given as a sum of lateral and vertical capacitance components, which can be roughly approximated by equation (3):

$$C_i = C_{iL} + C_{iV} \approx \epsilon_0 \times \epsilon_r \times L \times D_V / D_L + \epsilon_0 \times \epsilon_r \times L \times D_L / D_V \quad (3)$$

For example, if vertical distance ($D_V$) will increase, the first summation term increases, and the second term will decrease, thus compensating the capacitance variation due to for example manufacturing tolerances of the metallization layers and vias. The key point is to utilize the and balance the contribution of both lateral and vertical electric flux for capacitance implementation. This implies that the cross-section of the interdigitated electrode fingers should preferably have substantially equal lateral and vertical separations $D_V$ and $D_L$.

Figure 7:
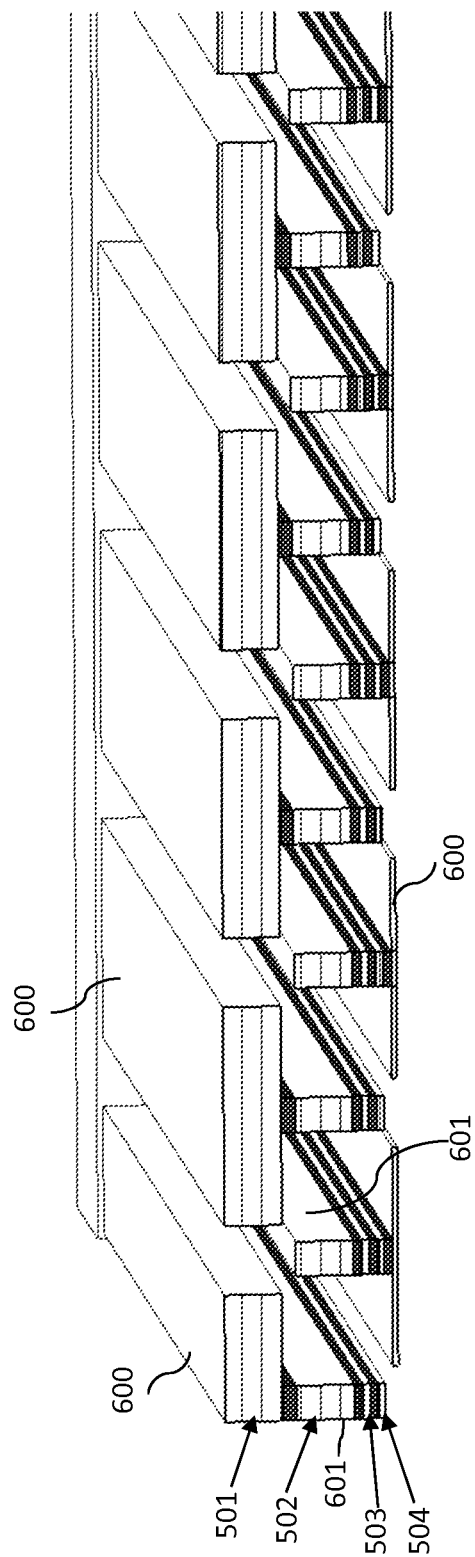
FIG. 7 is an illustrative perspective view of a cross-section of a 3D view of a practical MOM T-shape VLPP structure.

FIG. 7 shows an illustrative perspective view of a cross-section of a 3D view of a practical MOM T-shape VLPP structure illustrated in the FIG. 6. At least some of the metallization layers (501, 502, 503, 504) may have mutually different thicknesses. 3D electromagnetic simulations have been performed for such structure. The simulations show, that this kind of structure can compensate the metallization layer thickness variation very well. However, lateral shape inaccuracies of the metallization are not necessarily well compensated in this structure and may thus have significant influence on the capacitance tolerances if they cannot be controlled well enough.

In the structure of the FIG. 7, the bare thickness tolerances can be compensated reasonably well within +/−5% worst-case variation in the total capacitance. However, when also the accuracy of lateral shapes, in particular edges of the metal parts in lateral dimension, in other words lateral shape tolerance is taken into account, the variation increases, totalling approximately from −8% to +12%. That is because the outer edges of T-shape capacitor electrodes may extend closer to the vertical part of the opposing polarity electrode, if lateral dimensions of the lateral part are not accurate. However, the T-shape VLPP structure may provide a feasible alternative depending on the needed capacitor performance and capacitance density. Achieved accuracy of capacitance and performance of the VLPP capacitor structure is moreover affected by the accuracy of the manufacturing process, so that improved manufacturing methods may provide further improvement in the achievable capacitance tolerance.

One exemplary variation of the T-shape embodiment is an asymmetrical T-shape, in which the stem of the T is not disposed in the middle of the arm. Finger electrodes with asymmetrical T-shape may have their lateral parts (arms of the T-shape) fully superimposed in the cross-section, as long as the vertical part does not extend to the metallization layer that forms the superimposed lateral part on the opposite face of the capacitor structure. However, controlling capacitance may be more difficult for a fully superimposed asymmetrical T-shape electrodes in comparison to partially superimposed symmetrical T-shape electrodes. Finger electrodes with an asymmetrical T-shape may also be partially superimposed similarly to the symmetrical T-shape electrodes shown in FIGS. 6 and 7.

Figure 8:
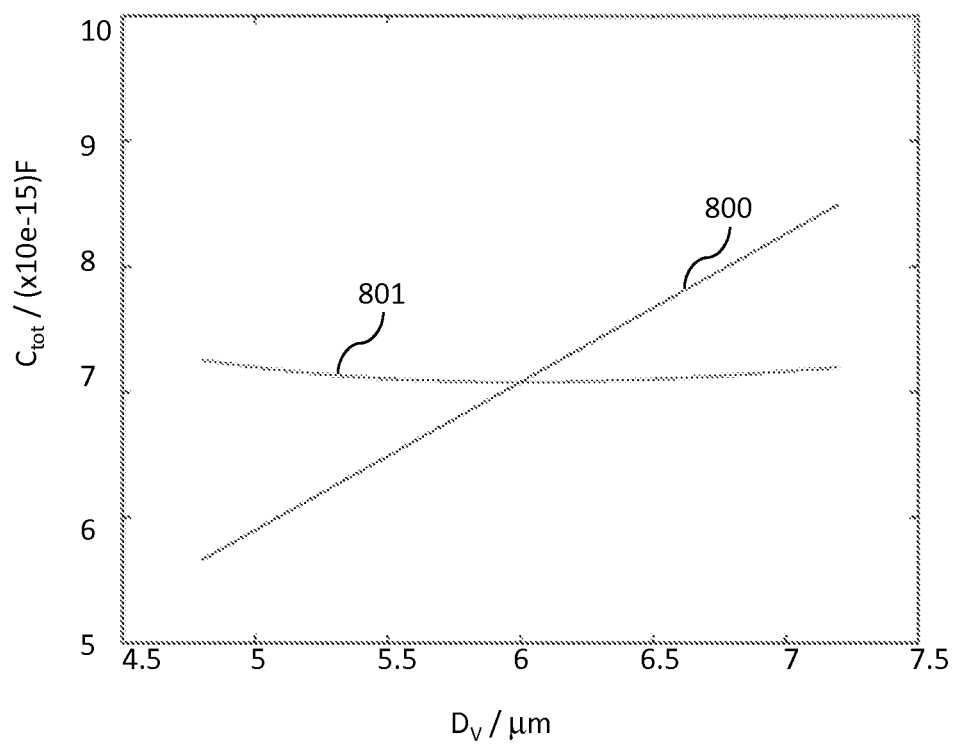
FIG. 8 shows a estimated capacitance variation comparison between a VLPP and a prior art VPP capacitor.

FIG. 8 shows an estimated capacitance variation comparison between a VLPP and a prior art VPP capacitor with same nominal capacitance in an exemplary case metal stack height varies +−20% around nominal value and other parameters are kept constant. Capacitance estimations are based on equations (2) and (3). In case of VLPP structure that is variation of vertical distance ($D_V$), and in case of VPP structure that is the variation of width W of the capacitor plates). The capacitance of a VPP structure (800) is approximately linearly dependent on the vertical distance ($D_V$) whereas the capacitance of a VLPP structure (801) has only very small capacitance variation over presented metal stack heights that define the vertical distance ($D_V$).

Because the equations (2) and (3) used for estimations do not consider fringing fields, plots in the FIG. 8 are not exact, but give a good insight on how the metal stack height variation is compensated by the improved capacitor finger design.

Figure 9:
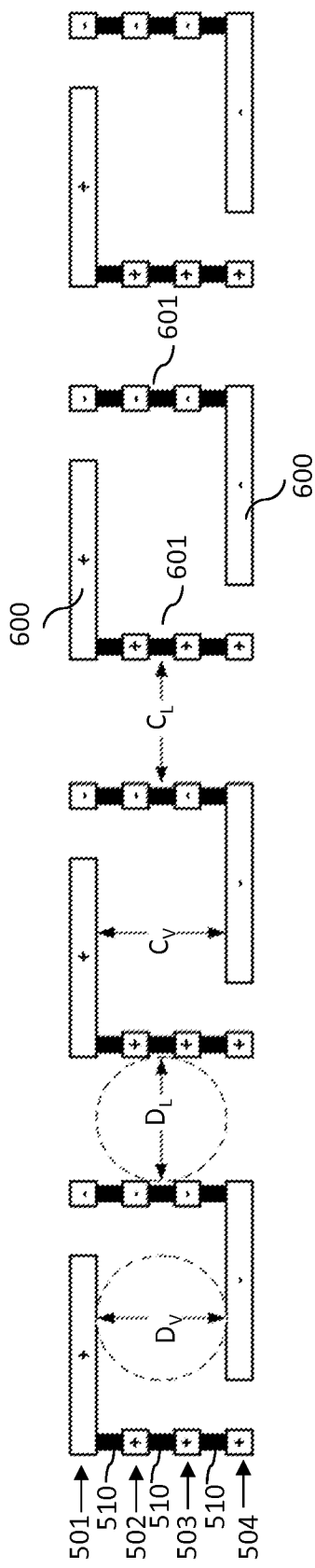
FIG. 9 shows a schematic cross-sectional view of a second exemplary embodiment for a capacitive element

FIG. 9 shows a schematic cross-sectional view of a second exemplary embodiment for a capacitive element suitable for example to be used in the chip antenna component, manufactured utilizing a plurality of BEOL (back-end-of-line) metallization layers of a semiconductor manufacturing process. Also this structure comprises a plurality of interdigitated positive (+) and negative (−) electrode fingers. In this example, there are four metallization layers (501, 502, 503, 504) and arrays of conductive vias (510) in between metallization layers. In this example with four metallization layers, the first metal (501) layer forms a lateral (horizontal) part (600) of every second electrode finger, and the fourth metallization layer (504) forms a lateral part (600) of the other set of interdigitated electrode fingers. However, any number of metallization layers may be used as long as the metallization layers enable construction of both lateral and vertical structures. Metallization layers forming the opposite top and bottom faces of the capacitor structure form the lateral parts (600) of the electrode fingers. In this example, the vertical parts (601) of the electrodes are formed by three superimposed metal slabs or bars formed on the intermediate metallization layers (502, 503) and the one of the top and bottom metallization layers (501, 504) not forming the lateral part (600) of the electrode finger and the vias (510) coupling the two intermediate metallization layers (502, 503) and the top or bottom metallization layer (504 or 501) with each other and to the respective one of the lateral parts (600). In this embodiment, lateral parts of adjacent positive and negative electrode are partially superimposed. In an alternative implementation, the vertical parts only comprise intermediate metallization layers (502, 503) and vias (510) but no slab or bar on one of the top or bottom face metallization layers (501, 504) opposite to the metallization layer that forms the lateral part (600) of the electrode finger.

Although thickness of the metallization layers (501, 502, 503, 504) in the FIG. 9 appears approximately equal, actual thickness of the metallization layers may vary. The structure can be considered as a combination of interdigitated capacitors wherein positive and negative electrodes are arranged in alternating manner and adjacent positive and negative electrodes have both vertically and laterally separated electrode plates. Since the vertical and lateral plates are part of the same electrode finger, these may be called as the vertical part and the lateral part. Lateral parts of two adjacent positive and negative electrode fingers have a vertical separation or a vertical distance ($D_V$) between them and vertical parts of two adjacent positive and negative electrode fingers have a lateral separation or a lateral distance ($D_L$) between them. This capacitor finger structure may also be called as a vertical-lateral-parallel-plate (VLPP) capacitor structure, and the specific embodiment may be called as an inverted L-shaped VLPP capacitor structure, the interdigitated finger electrodes have an inverted L-shape cross section, where lateral parts (600) form legs of the L-shapes and vertical parts (601) form stems of the L-shapes and the positive and negative L-shaped electrode fingers are in mutually inverted positions.

Figure 10:
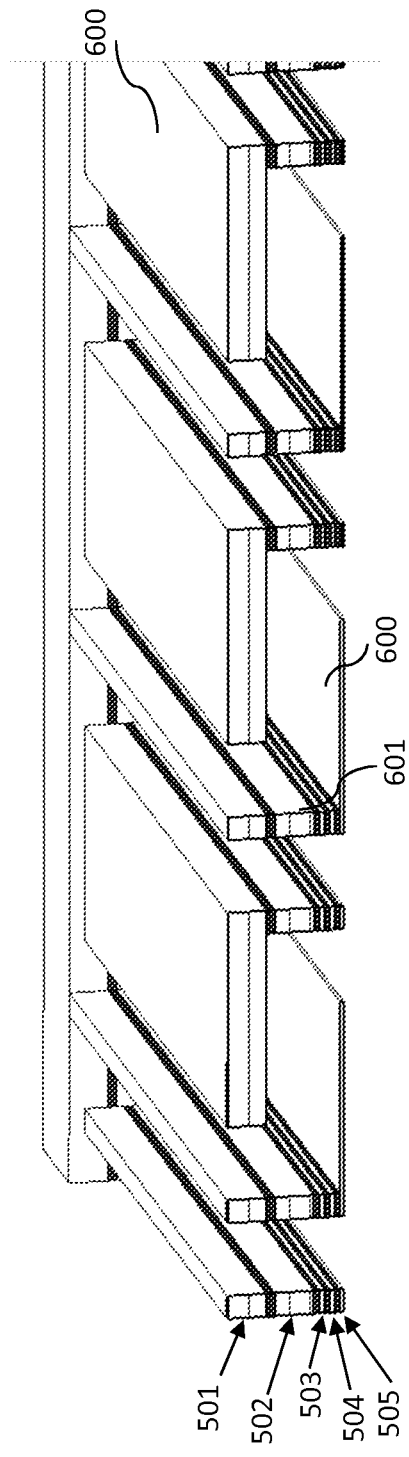
FIG. 10 is an illustrative perspective view of a cross-section of a 3D view of a practical MOM L-shape VLPP structure.

FIG. 10 shows an illustrative perspective view of a cross-section of a 3D view of a practical MOM L-shape VLPP structure illustrated in the FIG. 9. At least some of the metallization layers (501, 502, 503, 504, 505) may have mutually different thicknesses. 3D electromagnetic simulations have been performed for such structure, which show, that this kind of structure can compensate the metallization layer thickness variation very well.

The inverted L-shaped VLPP capacitor structure causes the main vertical and lateral fluxes to be formed on different physical locations and edges of the L-shaped capacitor electrodes are further away from each other than in the T-shape VLPP. These characteristics further improve control of capacitance tolerances and increased amount of dielectric between the positive and negative electrodes also reduces risk of disruptive discharges. In simulations, the capacitance tolerance of the inverted L-shaped VLPP has been found to go down to +−5%, which is sufficient for providing good performance of a chip antenna.

When several VLPP-type capacitors are built on a single piece of semiconductor, in addition to achieving the lowered tolerance of absolute capacitance value, capacitance match between the capacitors is very high on same IC.

In an alternative version of the inverted L-shape capacitor embodiment, lateral parts of adjacent electrodes may even be fully superimposed, as long as vertical part of the electrode does not extend to the metallization layer that forms the superimposed electrode's lateral part on the opposite face of the capacitor structure.

Table 1 below compares simulated achievable capacitance densities and capacitance tolerances of different types of parallel plate capacitors. VPP refers to a traditional Vertical Parallel Plate capacitor, and VPP-s refers to a "sparse" Vertical Parallel Plate capacitor with increased lateral distance between the vertical plates in comparison to a traditional VPP for improving tolerance but reducing capacitance density. T-VLPP refers to the T-shaped VLPP capacitor structure according to the first embodiment and L-VLPP refers to the inverted L-shaped VLPP capacitor structure according the second embodiment. Capacitance tolerances are expressed as maximum and minimum deviation from the intended capacitance value.

TABLE 1

| Capacitor type | Capacitance density fF/μm² | Max Total Tolerance | Min Total Tolerance | Max Vertical Tolerance | Min Vertical Tolerance |
|---|---|---|---|---|---|
| VPP | 0.024 | +29% | −17% | +15% | −13% |
| VPP-s | 0.003 | +13% | −11% | +10% | −9% |
| T-VLPP | 0.014 | +12% | −8% | +5% | −4% |
| L-VLPP | 0.006 | +6% | −3% | +3% | −1% |

Although increased distance between electrode fingers in the VLPP necessarily causes decrease in capacitance density, VLPP capacitors according to the disclosed embodiments can be advantageously manufactured that, in addition to improved (reduced) capacitance variance have both capacitance values suitable for chip antennas for use in mobile wireless device antennas and physical dimensions that fit mechanically well with dimensions of for example a slot antenna of a mobile wireless device, which are primarily defined by wavelength of the used RF carrier frequencies. Currently typical capacitance values achievable with such structure may be in range of 100 fF-5 pF, but the range of achievable capacitance values depend on manufacturing process and the range will likely increase (or vary) along with manufacturing technology development. Good correspondence of physical dimensions of the entire capacitive device with the physical dimensions of antenna elements outside the chip antenna also enables short interconnections between the active elements of the antenna, which further improves performance. Selection of the preferred applicable capacitor design depends on capacitance density and capacitance tolerance requirements of the specific device design.

FIG. 11 is a schematic cross-sectional view of a third embodiment of the invented capacitor structure. This structure is based on that of FIG. 6, with T-shape cross section of electrode fingers, but the entire structure has further been mirrored with respect to the metallization layer (504) that forms the lateral part (600b) of one set of the electrode fingers, i.e. arms of T-shapes of one set of electrode fingers.

In this example, there are pairs of positive electrode fingers that have their superimposed lateral parts (600a), i.e. arms of the T-shapes, on two opposite faces of the capacitor structure and their vertical parts (601a), i.e. stems of the T-shapes pointing in opposite vertical directions towards each other. Between the rows of pairs of positive T-shaped electrode fingers there are negative electrode fingers that have a single lateral part (600b) and two vertical parts (601b) pointing in opposite directions. Lateral part (600b) of the negative electrode finger is partially superimposed with the lateral parts (600a) of the positive electrode fingers.

This kind of structure may be beneficial, if there is a high number of metallization layers (501, 502, 503, 504, 505, 506, 507) available, since it may further increase capacitance density achieved on given area of the structure. Preferably, both vertical distances ($D_V$) and lateral distances ($D_L$) on both sides of the mirrored structure are equal. Although the illustration shows mirroring with respect of arms of negative electrode fingers, the capacitor structure may alternatively be mirrored with respect to a metallization layer that forms the lateral part of the positive electrode fingers, i.e. legs of the L-shapes of the positive electrode fingers. In other words, polarities of the positive and negative electrodes can be set either way.

As in previously shown embodiments, also in this embodiment, the metallization layers (501, 502, 503, 504, 505, 506, 507) may have mutually different nominal thicknesses. Preferably, thicknesses of metallization layers are designed so that vertical and lateral distances ($D_V$, $D_L$) remain equal.

FIG. 12 is a schematic cross-sectional view of a fourth embodiment of the invented capacitor structure. This structure is based on that of FIG. 9, with inverted L-shape cross section of electrode fingers, but the entire structure has further been mirrored with respect to the metallization layer (504) that forms the lateral part (600b) of one set of the electrode fingers, i.e. legs of L-shapes of one set of electrode fingers.

In this example, each positive electrode finger has two superimposed lateral parts (600a), i.e. legs of the L-shapes, on two opposite faces of the capacitor structure and a vertical part (601a) coupling the two lateral parts (600a) together. Negative electrode fingers have a single lateral part (600b) and two vertical parts (601b) pointing in opposite directions. Lateral part (600b) of the negative electrode finger is partially superimposed with the lateral parts (600a) of the adjacent positive electrode finger.

This kind of structure may be beneficial, if there is a high number of metallization layers (501, 502, 503, 504, 505, 506, 507) available, since it may further increase capacitance density achieved on given area of the structure. Preferably, both vertical distances ($D_V$) and lateral distances ($D_L$) on both sides of the mirrored structure are equal. Although the illustration shows mirroring with respect of arms of negative electrode fingers, the capacitor structure may alternatively be mirrored with respect to a metallization layer that forms the lateral part of the positive electrode fingers, i.e. legs of the L-shapes of the positive electrode fingers.

Also in this embodiment, the metallization layers (501, 502, 503, 504, 505, 506, 507) may have mutually different nominal thicknesses. Preferably, thicknesses of metallization layers are designed so that vertical and lateral distances ($D_V$, $D_L$) remain equal.

Figure 13:
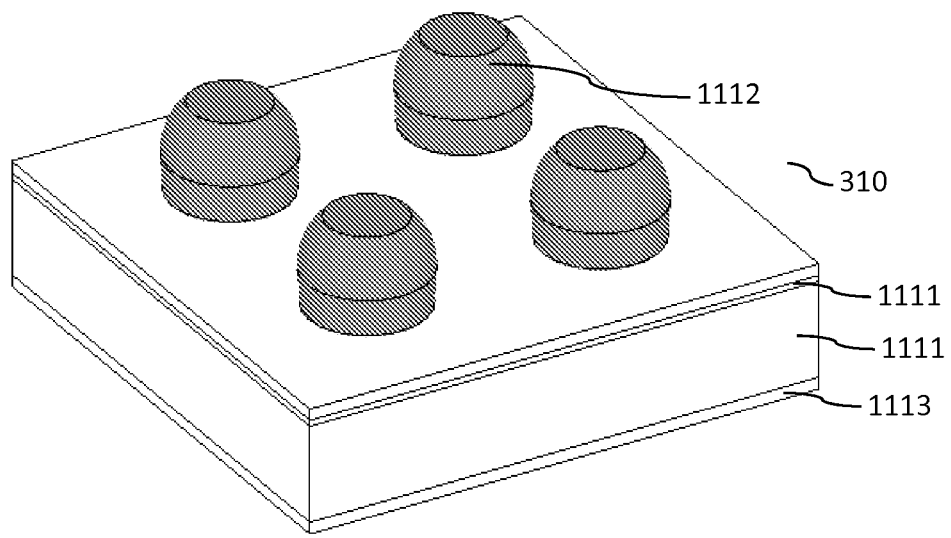
FIG. 13 shows an exemplary chip antenna component.

The FIG. 13 illustrates a perspective view from PCB contact side of an exemplary chip antenna component (310) implementation comprising a wafer level chip scale ball grid array design (WLCSP BGA) known in the art, including two capacitive devices according to the preferred embodiments of the invention. The chip antenna component (310) comprises a plurality of dielectric layers (1111) and two pairs of solder ball contacts (1112). Capacitor structures according to the preferred embodiments are built by metal sheets and vias disposed within and between the dielectric layers. The chip antenna component (310) may further comprise a backside coating. Preferably, dimensions of the chip antenna component (310) are designed such, that interconnections between the ball contacts and rest of the antenna design can be kept short.

Figure 14:
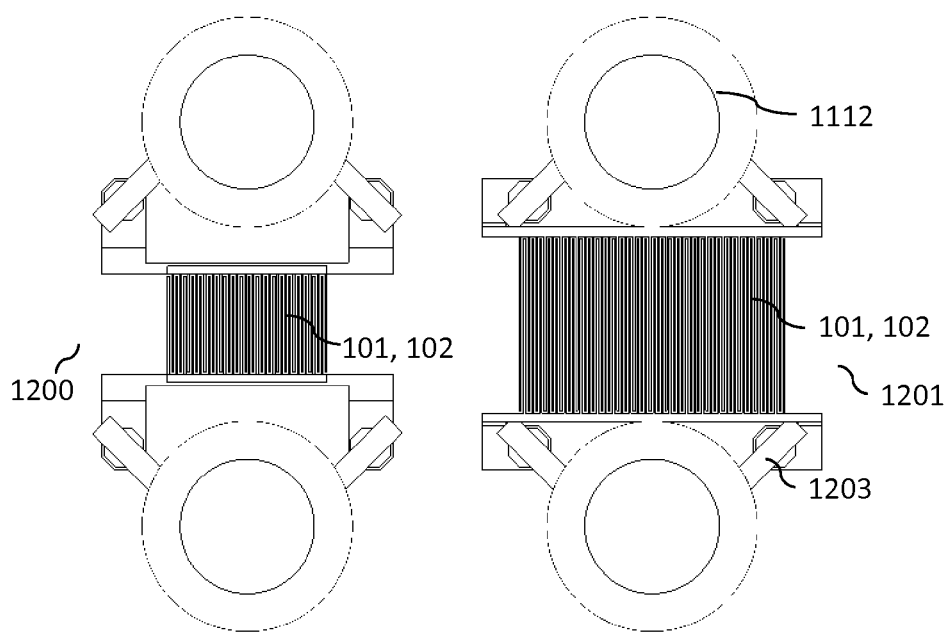
FIG. 14 illustrates bottom view of metal parts of a chip antenna component.

The FIG. 14 illustrates a bottom view of metal parts of the component shown in the FIG. 13 with all dielectrics hidden so that the interdigitated electrode fingers (101, 102) of the two capacitive devices (1200, 1201) according to the disclosed embodiments are visible. Electrical contacts (1203) are provided between the capacitor electrodes and the solder ball contacts (1112).

Figure 15:
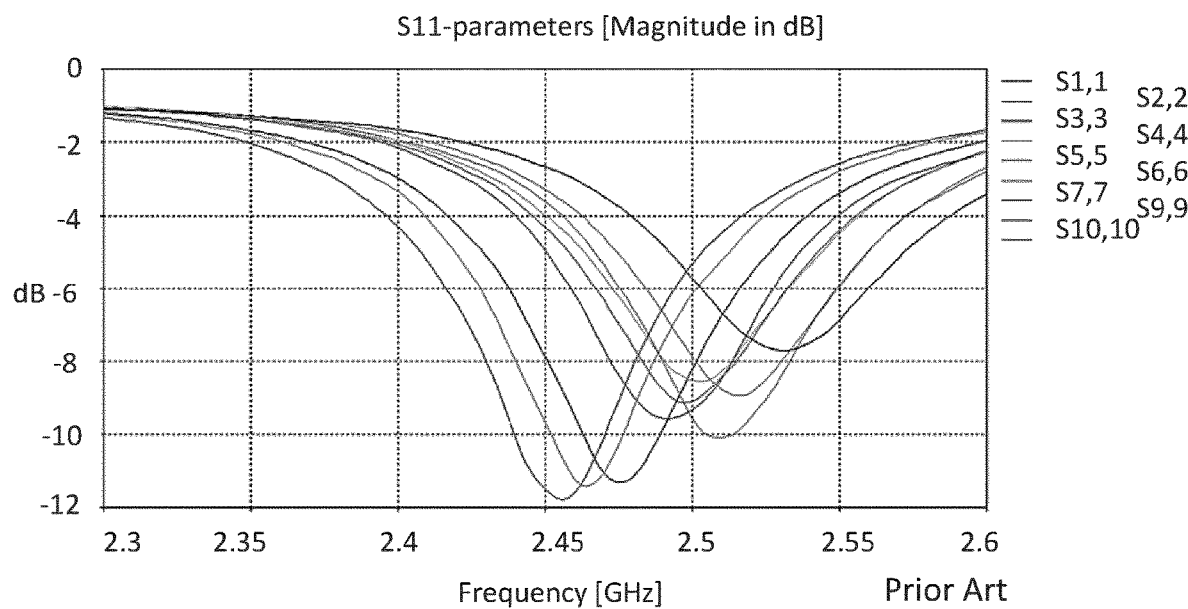
FIG. 15 illustrates S11-parameter variation of an antenna implemented using state of art ceramic chip antennas.

FIG. 15 illustrates antenna S11-parameter variation when state of art ceramic chip antenna is used. Measurements performed on an antenna using ten different chip antennas indicate significant variation both in frequency and return loss shown by the location and depth of the dip in the S11 curve.

Figure 16:
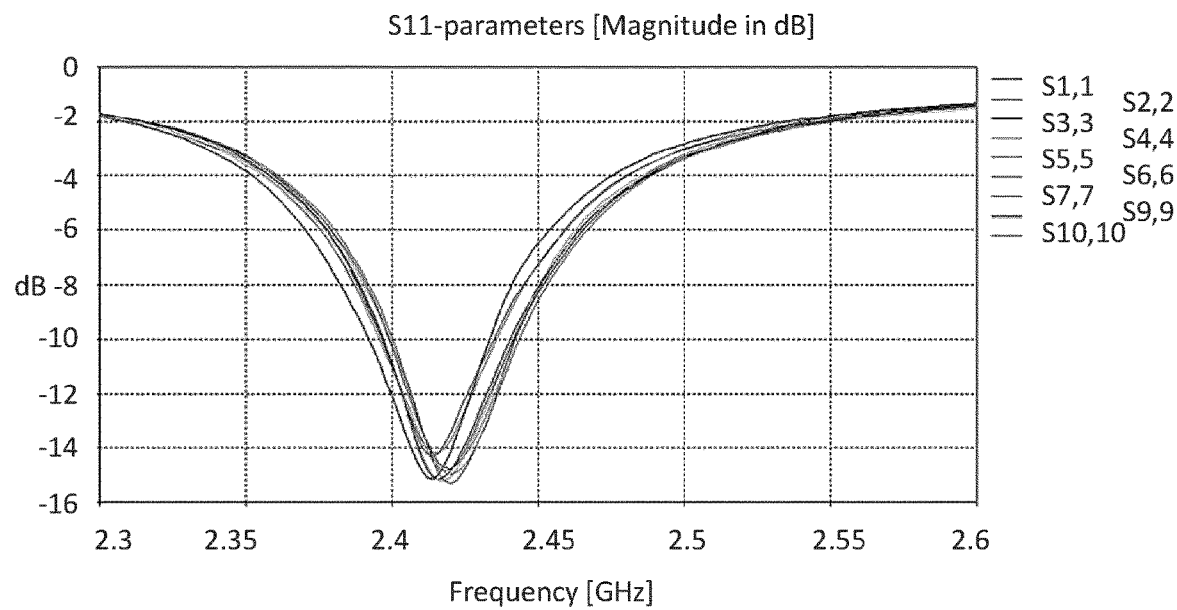
FIG. 16 illustrates S11-parameter variation of an antenna implemented using chip antenna according to a preferred embodiment.

FIG. 16 illustrates S11-parameter variation of an antenna implemented with a chip antenna according to a preferred embodiment. Likewise, ten different chip antennas were used in the measurements with otherwise similar antenna design. The measurement result indicates significant improvement in performance due to decreased variation both in frequency and in return loss in comparison to the significant variation shown in the FIG. 15.

In further embodiments, the chip antenna component may further comprise circuit elements for tuning and/or matching purposes, such as adjustable or selectable reactive elements in shunt and/or series configuration in the signal path. More particularly the chip antenna component may comprise one or more variable capacitors or capacitor arrays or banks with semiconductor switches or adjustable capacitors. Further, the chip antenna component may comprise one or more variable inductors or an inductor array or bank with adjustable inductors.

Figure 17:
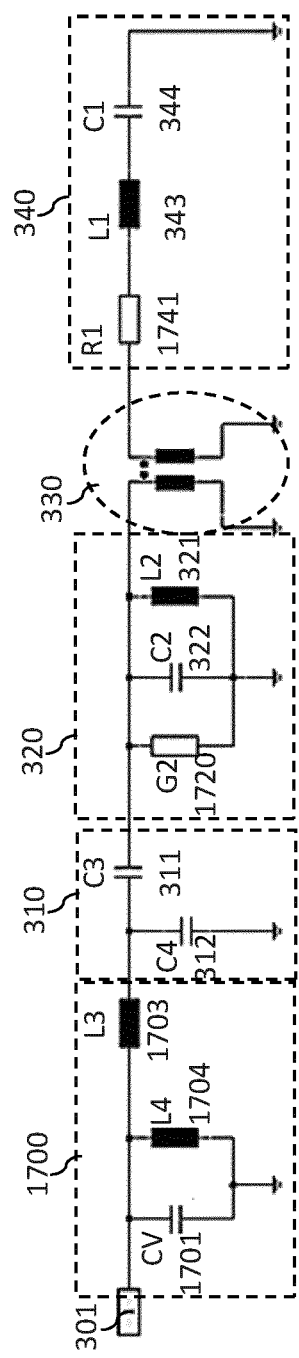
FIG. 17 illustrates a simplified circuit model equivalent of a first tuneable antenna.
Figure 18:
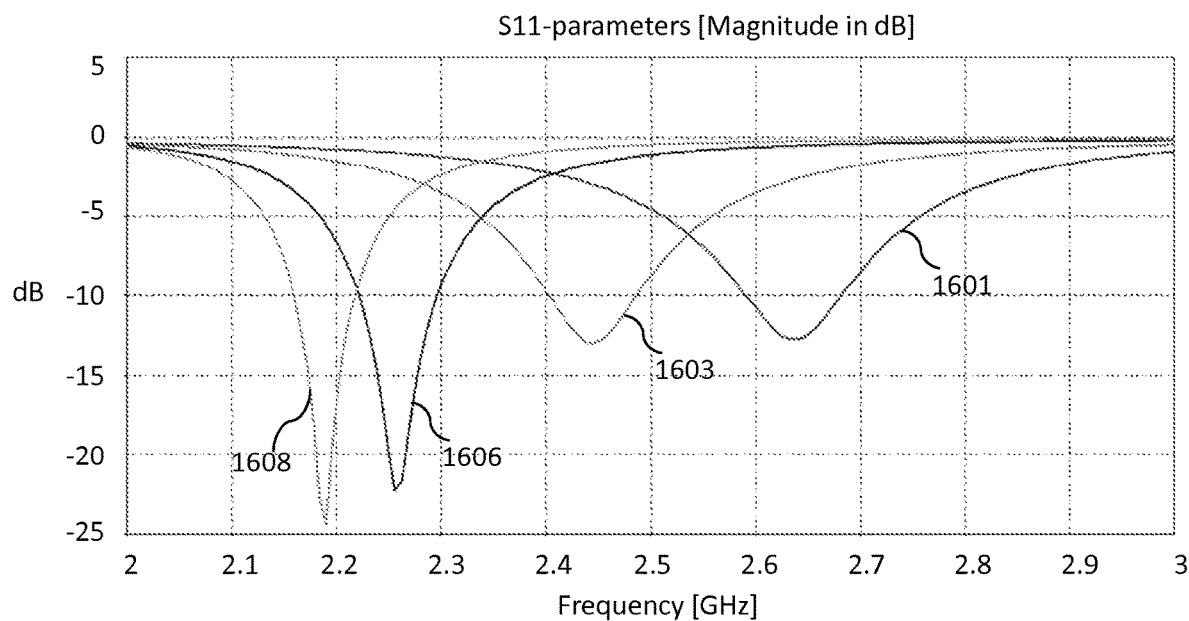
FIG. 18 illustrates S11-parameters of the first tuneable antenna.

FIG. 17 illustrates an additional embodiment of the invention, in which the chip antenna is further provided with a tuning circuitry (1700) for tuning the frequency of the antenna. The tuning circuitry (1700) comprises a variable capacitor $C_V$ (1701), and additional reactance components L3 (1703) and L4 (1704) as shown in the circuit model. Other parts of the antenna design remain similar to that shown in the FIGS. 3a, 3b and 4. For simplicity, conductance components GsL and GsR in the circuit equivalent model have been replaced with a single conductance component G2 (1720), and resistance components RpR and RpL have been replaced with a single resistance component R1 (1741). By adjusting capacitance value of the variable capacitor, S-parameters of the antenna may be adjusted. The FIG. 18 illustrates adjustment of S11-parameter. S11-parameter curves in the FIG. 18 illustrate obtained S11-parameters with different variable capacitor $C_V$ (1701) capacitance values in an exemplary design. The S11-parameter curve 1601 is obtained using value $C_V$=1 pF, curve 1603 is obtained using $C_V$=3 pF, curve 1606 is obtained using $C_V$=6 pF, and curve 1608 is obtained using $C_V$=8 pF.

Figure 19:
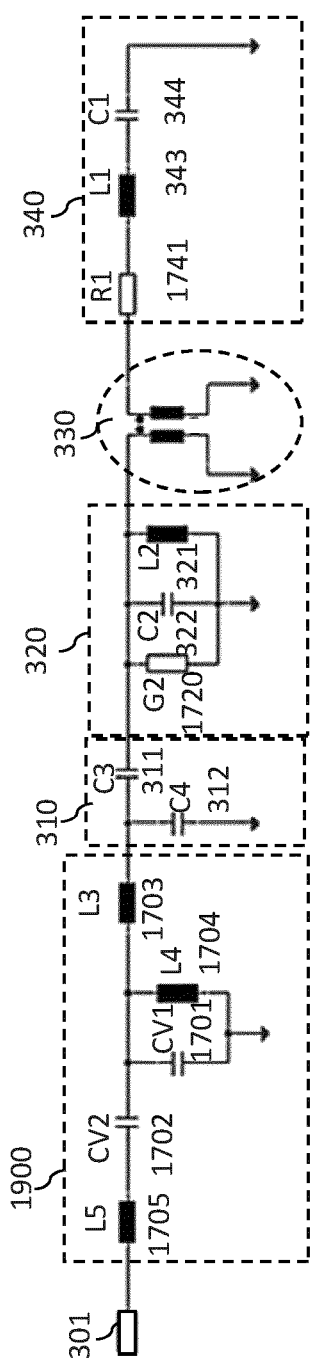
FIG. 19 illustrates a simplified circuit model equivalent of a second tuneable antenna.
Figure 20:
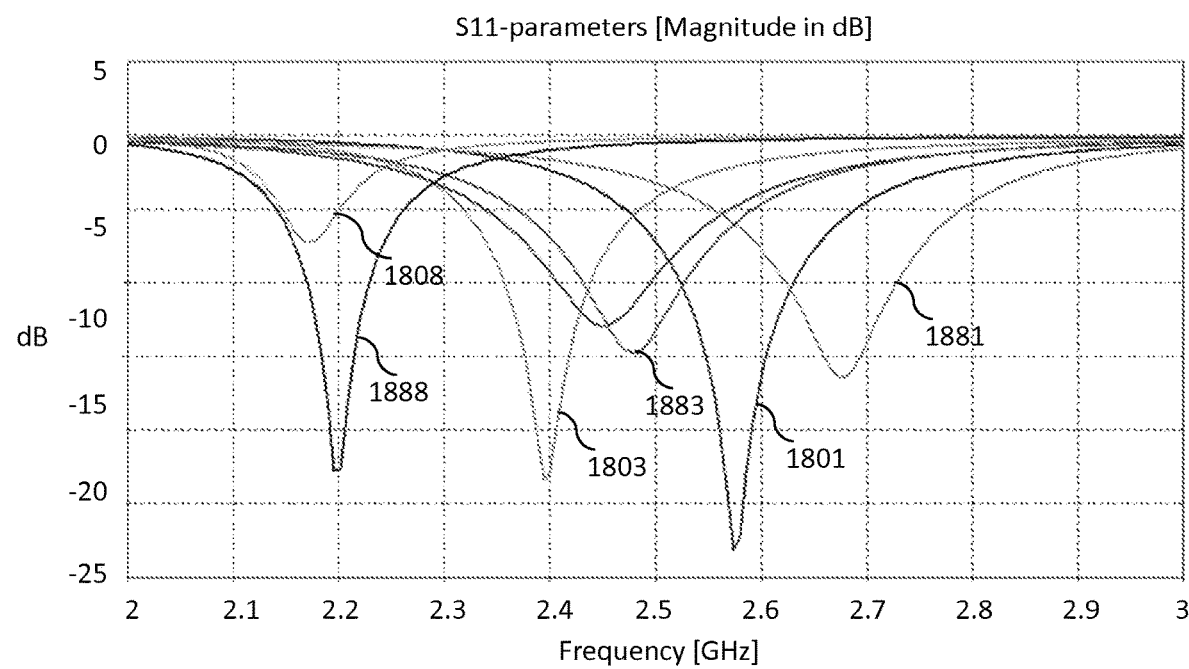
FIG. 20 illustrates S11-parameters of the second tuneable antenna.

FIG. 19 illustrates another additional embodiment of the invention, in which the chip antenna component is further provided with tuning and matching circuitry (1900) for tuning the frequency of the antenna. The tuning and matching circuitry (1900) comprises two variable capacitors, a tuning capacitor $C_{V1}$ (1701) and matching capacitor $C_{V2}$ (1702), as well as additional reactance components L3 (1703), L4 (1704) and L5 (1705) shown in the model. Other parts of the antenna design remain similar to that shown in the FIGS. 3a, 3b and 4. For simplicity, as in the FIG. 17, reactance components GsL and GsR in the circuit equivalent model have been replaced with a single reactance component G2 (1720), and resistance components RpR and RpL have been replaced with a single reactance component R1 (1741). By adjusting capacitance value of the variable capacitors, S-parameters of the antenna may be adjusted. The FIG. 20 illustrates adjustment of S11-parameter. Adjustment of the variable tuning capacitor $C_{V1}$ (1701) mainly affects operating frequency of the antenna and adjustment of the variable matching capacitor $C_{V2}$ (1702) mainly affects return loss of the antenna. For example, S11-parameter curves 1801, 1803 and 1808 in the FIG. 20 have been obtained by setting matching capacitor value $C_{V2}$=1 pF, while the tuning capacitor $C_{V1}$ was varied to values of 1 pF, 3 pF and 8 pF, respectively. Likewise, S11-parameter curves 1881, 1883 and 1888 have been obtained by setting the matching capacitor value $C_{V2}$=8 pF, while the tuning capacitor $C_{V1}$ was varied to values of 1 pF, 3 pF and 8 pF, respectively It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. A capacitor structure implemented using a semiconductor process, the capacitor structure comprising a plurality of interdigitated positive and negative electrode fingers separated by a dielectric material, and a plurality of patterned metallization layers separated by the dielectric material, wherein each interdigitated electrode finger comprises:
a lateral part formed by one of at least two parallel first metallization layers, and
a vertical part comprising a plurality of superimposed slabs or bars formed by a plurality of second metallization layers that reside between said first metallization layers, wherein the slabs or bars are electrically connected to each other and to the lateral part with a plurality of electrically conducting vias traversing through dielectric material separating adjacent metallization layers, and in that vertical distance between each pair of at least partially superimposed lateral parts of two adjacent electrode fingers is equal to lateral distance between two adjacent vertical parts, or vertical distance between each pair of at least partially superimposed lateral parts of two adjacent electrode fingers is equal to lateral distance between two adjacent vertical parts that have no lateral part disposed therebetween.

2. The capacitor structure according to claim 1, wherein lateral parts of two adjacent electrode fingers are disposed on different one of the first metallization layers.

3. The capacitor structure according to claim 1, wherein the more than one superimposed slabs or bars further comprise a slab or bar disposed on the first metallization layer that does not comprise the vertical part of the same electrode finger.

4. The capacitor structure according to claim 1, wherein two interdigitated combs are formed by the plurality of positive electrode fingers mutually electrically coupled at one end of the fingers and the plurality of negative electrode fingers mutually electrically coupled at an opposite end of the fingers.

5. The capacitor structure according to claim 1, wherein a cross-section of the mutually coupled vertical part and lateral part of two interdigitated electrode finger forms an L-shape, wherein the lateral part forms the leg of the L-shape and the vertical part forms the stem of the L, and wherein legs of two adjacent L-shapes extending to mutually opposite lateral directions are disposed on different one of the first metallization layers of the capacitor structure, and wherein stems of adjacent L-shapes point in opposite vertical directions.

6. The capacitor structure according to claim 5, wherein the lateral distance is defined between different adjacent electrode finger than the vertical distance.

7. The capacitor structure according to claim 5, wherein the capacitor structure comprises three first metallization layers, and the capacitor structure is mirrored with respect to the first metallization layer that forms legs of positive or negative interdigitated L-shape electrode fingers such that each of the positive or negative electrode fingers comprises two lateral parts superimposed with each other and disposed on two opposite faces of the capacitor structure, and a vertical part coupling the two lateral parts, and its adjacent negative or positive electrode finger comprises a single lateral part disposed on a first metallization layer that is disposed between the two opposite faces of the capacitor structure, and two vertical parts directed to opposite vertical directions from the single lateral part, wherein the single lateral part is at least partially superimposed between the two lateral parts.

8. The capacitor structure according to claim 1, wherein cross-section of the mutually coupled vertical part and the lateral part of two interdigitated electrode finger forms a T-shape, wherein the lateral part forms the arm of the T-shape and the vertical part forms the stem of the T-shape, and wherein stems of adjacent T-shapes point in opposite vertical directions and arms of adjacent T-shapes are disposed on different first metallization layers of the capacitor structure.

9. The capacitor structure according to claim 8, wherein lateral distance is defined between the same adjacent electrode finger as the vertical distance.

10. The capacitor structure according to claim 8, wherein the capacitor structure comprises three first metallization layers, and the capacitor structure is mirrored with respect to the first metallization layer that forms arms of positive or negative interdigitated T-shape electrode fingers such that there is a pair of positive or negative T-shape electrode fingers with their lateral parts superimposed with each other and disposed on two opposite faces of the capacitor structure, and their vertical parts directed to opposite directions towards each other, and their adjacent negative or positive electrode finger comprises a single lateral part disposed on a first metallization layer that is disposed between the two opposite faces of the capacitor structure, and two vertical parts directed to opposite vertical directions from the single lateral part, wherein the single lateral part is at least partially superimposed between the two lateral parts.

11. The capacitor structure according to claim 1, wherein spacing between any parts of two adjacent electrode fingers is at least 5 times, preferably at least 10 times a minimum manufacturing process line width of a manufacturing process used in manufacturing of the capacitor structure.

12. A chip antenna device comprising at least one, preferably at least two capacitor structures according to claim 1.

13. The chip antenna device of claim 12, wherein the chip antenna device is disposed in a wafer level chip scale ball grid array (WLCSP BGA) package.

14. The chip antenna device according to claim 12, wherein the chip antenna device further comprises at least one adjustable capacitor in shunt and/or series configuration.

15. An antenna structure exploiting ground plane radiation, wherein the antenna structure comprises a chip antenna according to claim 12.

* * * * *